(12) United States Patent
Oguchi et al.

(10) Patent No.: US 7,783,437 B2
(45) Date of Patent: Aug. 24, 2010

(54) ARC MONITORING SYSTEM

(75) Inventors: Yoshihisa Oguchi, Tokyo (JP); Kenichi Shimbo, Tokyo (JP); Atsushi Suzuki, Aichi (JP); Toshiya Kumai, Aichi (JP); Hisaya Saitou, Aichi (JP)

(73) Assignees: Mitsubishi Denki Kabushiki Kaisha, Tokyo (JP); Chubu Electric Power Co., Inc., Nagoya-shi (JP)

( * ) Notice: Subject to any disclaimer, the term of this patent is extended or adjusted under 35 U.S.C. 154(b) by 925 days.

(21) Appl. No.: 10/573,074

(22) PCT Filed: Sep. 22, 2004

(86) PCT No.: PCT/JP2004/013781

§ 371 (c)(1),
(2), (4) Date: Dec. 11, 2006

(87) PCT Pub. No.: WO2005/029660

PCT Pub. Date: Mar. 31, 2005

(65) Prior Publication Data

US 2007/0108990 A1    May 17, 2007

(30) Foreign Application Priority Data

Sep. 24, 2003   (JP) .............................. 2003-331883

(51) Int. Cl.
 *G01R 31/00* (2006.01)
 *G01M 19/00* (2006.01)
(52) U.S. Cl. .................. 702/59; 702/121; 702/122; 702/123
(58) Field of Classification Search ............ 702/59–62, 702/121–123, 187–189; 382/100
See application file for complete search history.

(56) References Cited

U.S. PATENT DOCUMENTS

| 5,153,722 A | * | 10/1992 | Goedeke et al. ............. 348/159 |
| 2005/0012626 A1 | * | 1/2005 | Owrutsky et al. ........... 340/578 |
| 2007/0055889 A1 | * | 3/2007 | Henneberry et al. ........ 713/186 |

FOREIGN PATENT DOCUMENTS

| JP | 3-293909 | 12/1991 |
| JP | 5-318116 | 12/1993 |

(Continued)

*Primary Examiner*—Eliseo Ramos Feliciano
*Assistant Examiner*—Phuong Huynh
(74) *Attorney, Agent, or Firm*—Oblon, Spivak, McClelland, Maier & Neustadt, L.L.P.

(57) ABSTRACT

An arc monitor system locates an arc based on optimal frames from a frame obtained before an arc discharge to a frame obtained immediately after the arc discharge. The arc monitor system, used to locate an occurred place of an arc discharge that occurred in an electric facility, includes multiple monitor cameras arranged at multiple places in the electric facility, an image processing device that processes images received from the respective monitor cameras, a control logic section that controls the image processing device, and an operation device that includes a display section and an operation section and is connected to the control logic section. The image processing device and the control logic section extract a change in the images received from the monitor cameras in response to a control signal generated from the electric facility on an occurrence of the arc discharge, and then locate an occurred place of the arc discharge.

14 Claims, 4 Drawing Sheets

| | FOREIGN PATENT DOCUMENTS | | |
|---|---|---|---|
| JP | 8-122399 | | 5/1996 |
| JP | 08122399 | * | 5/1996 |
| JP | 8-168102 | | 6/1996 |
| JP | 11-098628 | | 4/1999 |
| JP | 11-103512 | | 4/1999 |
| JP | 11098628 | * | 4/1999 |

* cited by examiner

1 : ARC MONITOR CAMERA
5 : MACHINE MONITOR CAMERA
10 : BUS PROTECTION SIGNAL

43 : CENTER OF GRAVITY
44 : FERET'S DIAMETER

ARC MONITORING SYSTEM

TECHNICAL FIELD

The present invention relates to an arc monitor system in which a camera is used to detect a short circuit accident between live lines or a grand fault accident between a live line and the earth (so-called "arc discharge") in various types of electric facilities such as a substation, and then a failure point (a place where the arc discharge is occurred) is identified (referred to as "located" hereinafter) in the electric facilities, and more particularly to an arc monitor system in which multiple cameras are used to capture images of a occurred place of an arc discharge, and the occurred place is located by image processing devices thereby precisely locating and displaying a failed system.

BACKGROUND ART

A conventional arc monitor system is configured to use a general CCTV camera to detect arc light on a generation of an arc, and locates a block of a located place of the failure point based on a screen of a single image (refer to Patent Document 1, for example).

However, it is not possible to cause an aperture value of a lens to optimally respond to a momentary light emission caused by an arc current (to close the aperture), and a captured image of the arc discharge thus results in a saturated white image in most cases.

Patent Document 1: JP 11-98628 A

DISCLOSURE OF THE INVENTION

Problems to be Solved by the Invention

Since the conventional arc monitor system tries to capture an image during an arc discharge with a general CCTV camera, there is a problem in that an arc discharge, which is occurred and disappears momentarily, cannot be captured in a state suitable for image processing. Moreover, a place of an arc discharge to be imaged is often blocked by obstacles present in a surrounding environment and various environmental changes (fog, rain, and snow), and the place of the arc discharge is thus hidden from the camera, resulting in a degraded precision of the locating.

Further, there is a problem in that a occurred place of an arc may be erroneously detected due to a reflection of the arc light by insulators or a ground.

Means for Solving the Problems

An arc monitor system according to the present invention is used to locate a occurred place where an arc discharge is occurred in an electric facility, and includes: a plurality of monitor cameras that are arranged at a plurality of places in the electric facility; an image processing device that individually processes images received from the monitor cameras; a control logic section that controls the image processing device; and an operation device that has a display section and an operation section, and is connected to the control logic section. In the arc monitor system, the image processing device and the control logic section extract a change in the images received from the monitor cameras in response to a control signal generated from the electric facility on a occurrence of the arc discharge, and then locate a occurred place of the arc discharge.

EFFECT OF THE INVENTION

According to the present invention, it is possible to increase reliability of the arc detection by locating an arc based on optimal frames from a frame before the arc discharge to a frame immediately after the arc discharge.

BEST MODE FOR CARRYING OUT THE INVENTION

The present invention has been made to solve the above problems, and has an object to provide an arc monitor system capable of locating an arc based on optimal frames by processing multiple frames (thirty frames, for example) from a frame on an arc discharge to a frame immediately after the arc discharge, increasing a precision of detection of arc light regardless of a change in an arc discharge current and a change in an natural environment (such as rain, snow, and fog), and detecting an arc discharge with high reliability.

Moreover, an object of the present invention is to provide an arc monitor system in which multiple monitor cameras for near-infrared light obtained by removing visible light are used to evaluate remaining heat after an arc discharge, thereby enabling to monitor an arc current in a wide range, resulting in a reduction of dead angles due to an extension of an arc, and simultaneously, a reduction of reflections on insulators and a ground.

Moreover, an object of the present invention is to provide an arc monitor system in which multiple cameras are arranged in orthogonal directions in an electric facility, locating is carried out again on a plan view by means of the triangulation according to locating results based on respective images captured by the cameras, thereby improving the locating precision.

Further, an object of the present invention is to identify a occurred place of an arc discharge, and to clarify a range to locate a failure point according to a line switching state, thereby finding out a cause of the failure, and quickly recovering from the failure.

First Embodiment

A detailed description will now be given of a first embodiment of the present invention with reference to the drawings.

Figure 1:
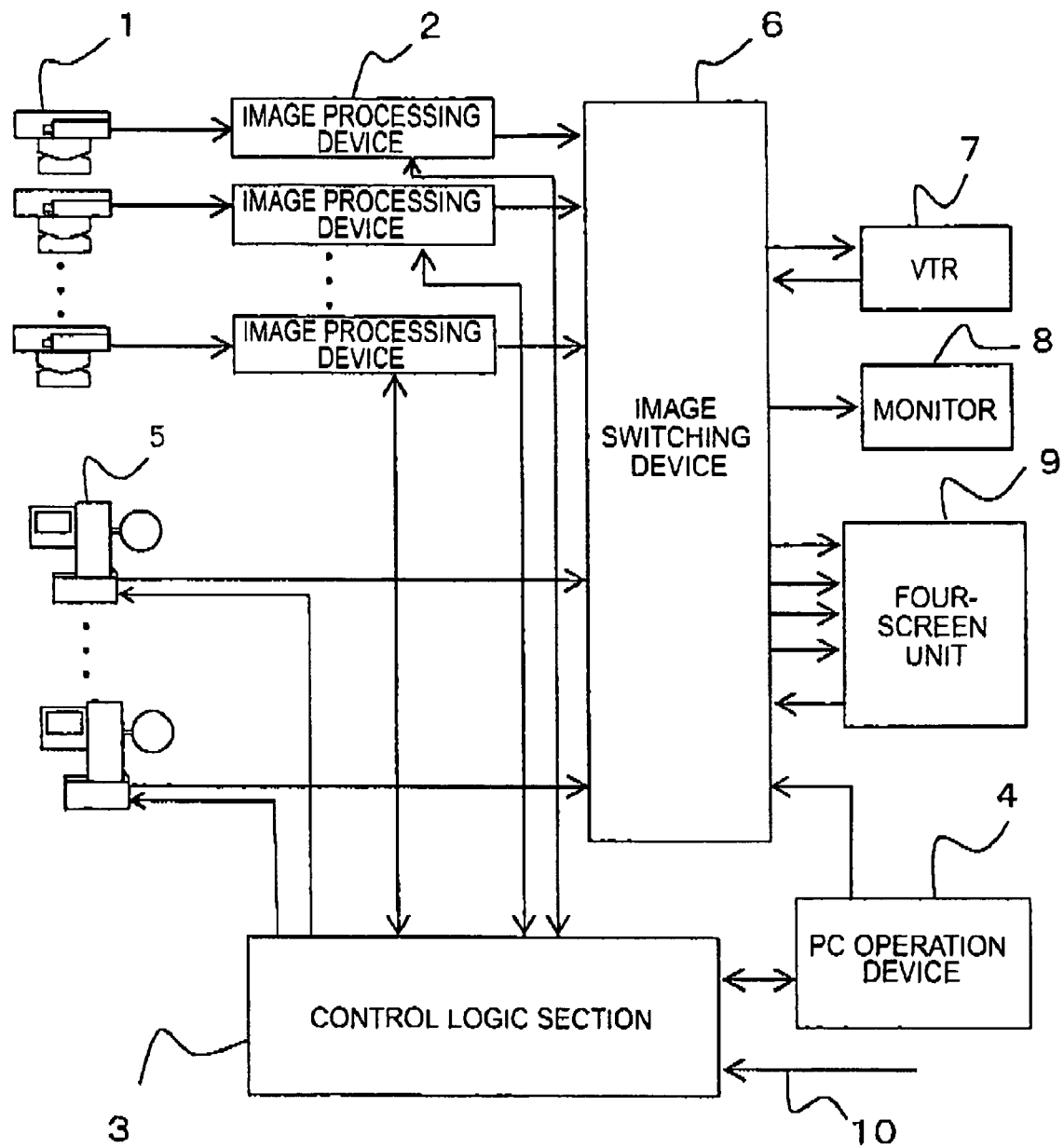
FIG. 1 A block diagram showing a first embodiment of the present invention (first embodiment).

FIG. 1 is a block diagram showing an arc monitor system according to the first embodiment of the present invention.

In FIG. 1, multiple arc monitor cameras 1 are arranged to capture images of a occurred place of an arc discharge in an electric facility, and respectively include a near-infrared arc monitor camera equipped with a visible light cut filter.

Multiple image processing devices 2 are provided correspondingly to the respective arc monitor cameras 1, and output a center of gravity of an arc discharge as a two-dimensional (X-Y) coordinate based on the camera image captured by the respective arc monitor cameras 1.

A control logic section 3 obtains the multiple coordinates of the center of gravity of the arc obtained by the respective image processing devices 2, carries out the triangulation according to arbitrary combinations of the cameras, and locates a place of the arc discharge in a coordinate system on a plan view.

A PC (personal computer) operation device 4 is connected to the control logic section 3 as an external device includes a display section and an operation section (described later), and operates the system shown in FIG. 1.

Multiple machine monitor cameras 5 are arranged to capture images of various machines in the electric facility, and monitor a place of an arc occurred immediately after a generation of an arc discharge accident.

An image switching device 6 is operated from the PC operation device 4 to switch the images of the respective arc monitor cameras 1, the processed images of the respective image processing devices 2, and the images of the respective machine monitor cameras 5, and outputs switched images.

Connected to an output terminal side of the image switching device 6 are a VTR 7, a monitor 8, and a four-screen unit 9.

The VTR 7 is connected bi-directionally to the image switching device 6, and records an image switched and output by the image switching device 6. The monitor 8 shows an image switched and output by the image switching device 6.

The four-screen unit 9 is bi-directionally connected to the image switching device 6, and respective four divided sections of the monitor 8 show images from arbitrary cameras selected by the image switching device 6 according to an operation on the PC operation device 4.

A bus protection signal 10 is an alarm signal serving as a control signal generated from the electric facility (not shown) on a occurrence of an arc discharge, and is input to the control logic section 3.

The two-dimensional coordinate output from the respective image processing devices 2 is obtained with respect to an pixel coordinate system with an upper left corner as an origin, for example, when the image of the arc monitor camera 1 is output on the monitor 8.

Figure 2:
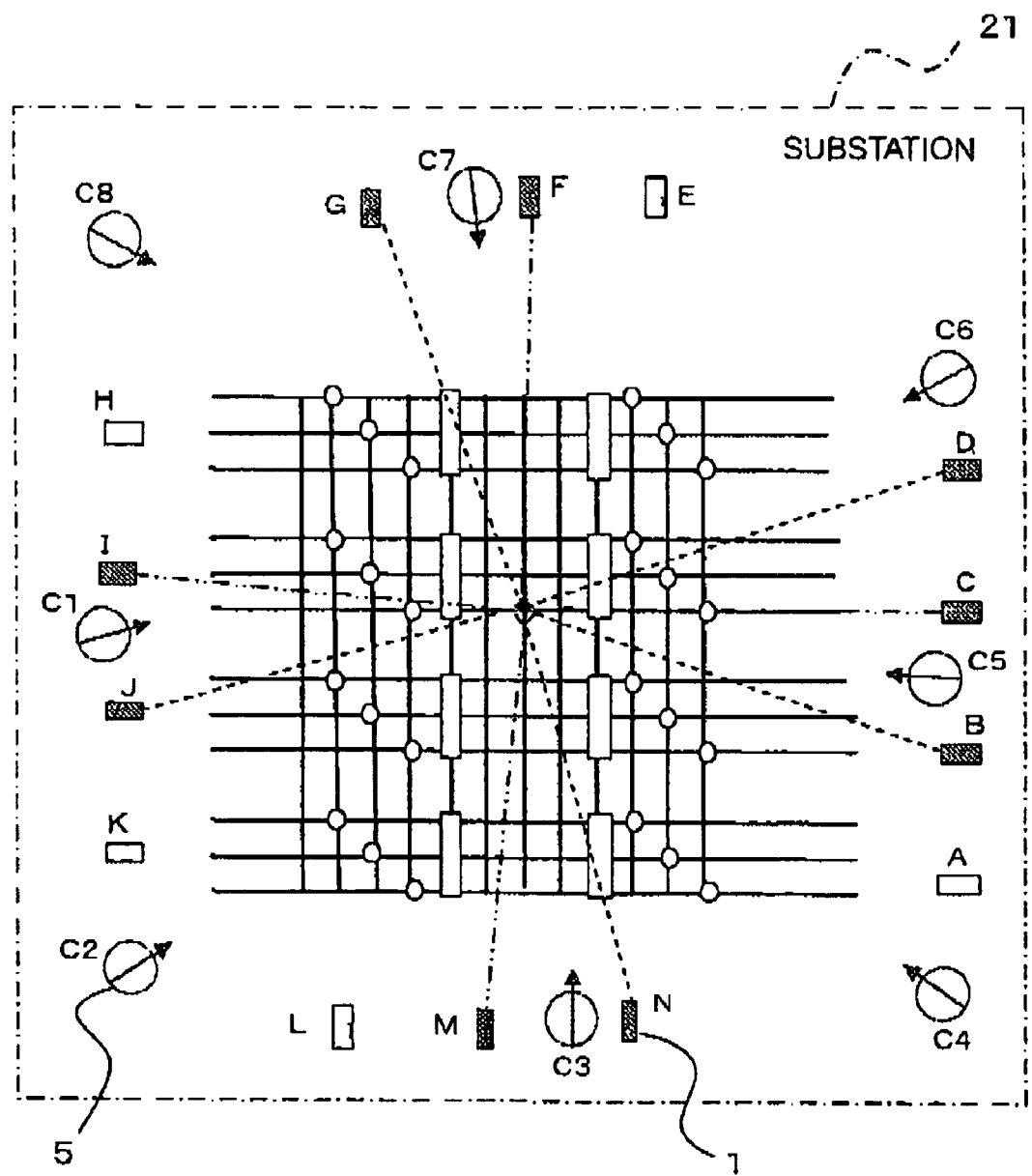
FIG. 2 An explanatory view of an arrangement of arc monitor cameras and machine monitor cameras according to the first embodiment of the present invention (first embodiment).

FIG. 2 is an explanatory view two-dimensionally showing a camera arrangement in a substation according to the first embodiment of the present invention. It should be noted that although a description will be given of the substation as an example, it is apparent that the first embodiment is applicable to not only the substation but also other electric facilities.

In FIG. 2, the arc monitor cameras 1 include fourteen cameras A to N, and are arranged along a periphery in a substation 21. Of these cameras, four cameras A to D are arranged on the right side in the figure, three cameras E to F are arranged on the top side in the figure, four cameras H to K are arranged on the left side in the figure, and three cameras L to N are arranged on the bottom side in the figure.

Of the respective arc monitor cameras 1, cameras B, C, D, F, G, I, J, M, and N which actually detected an arc discharge are indicated by hatching.

Moreover, of multiple arc monitor cameras 1 arranged on the same row, locating results from the cameras C, F, I, and M which most largely captured the arc discharge are indicated by long dashed double-short dashed lines.

A center point in FIG. 2 is a crossing point of the respective locating results (long dashed double-short dashed lines) of the cameras which most largely captured the arc on the same rows, and is a occurred point of the arc.

In this way, FIG. 2 clearly shows the arc occurred area on a two-dimensional arrangement of the substation 21.

The machine monitor cameras 5 include eight cameras C1 to C8 respectively arranged in eight directions, for example. The respective machine monitor cameras 5 are panning cameras, are automatically preset in a direction in which an arc occurrence is located, and are also manually operated to monitor a occurred place of an arc.

Figure 3:
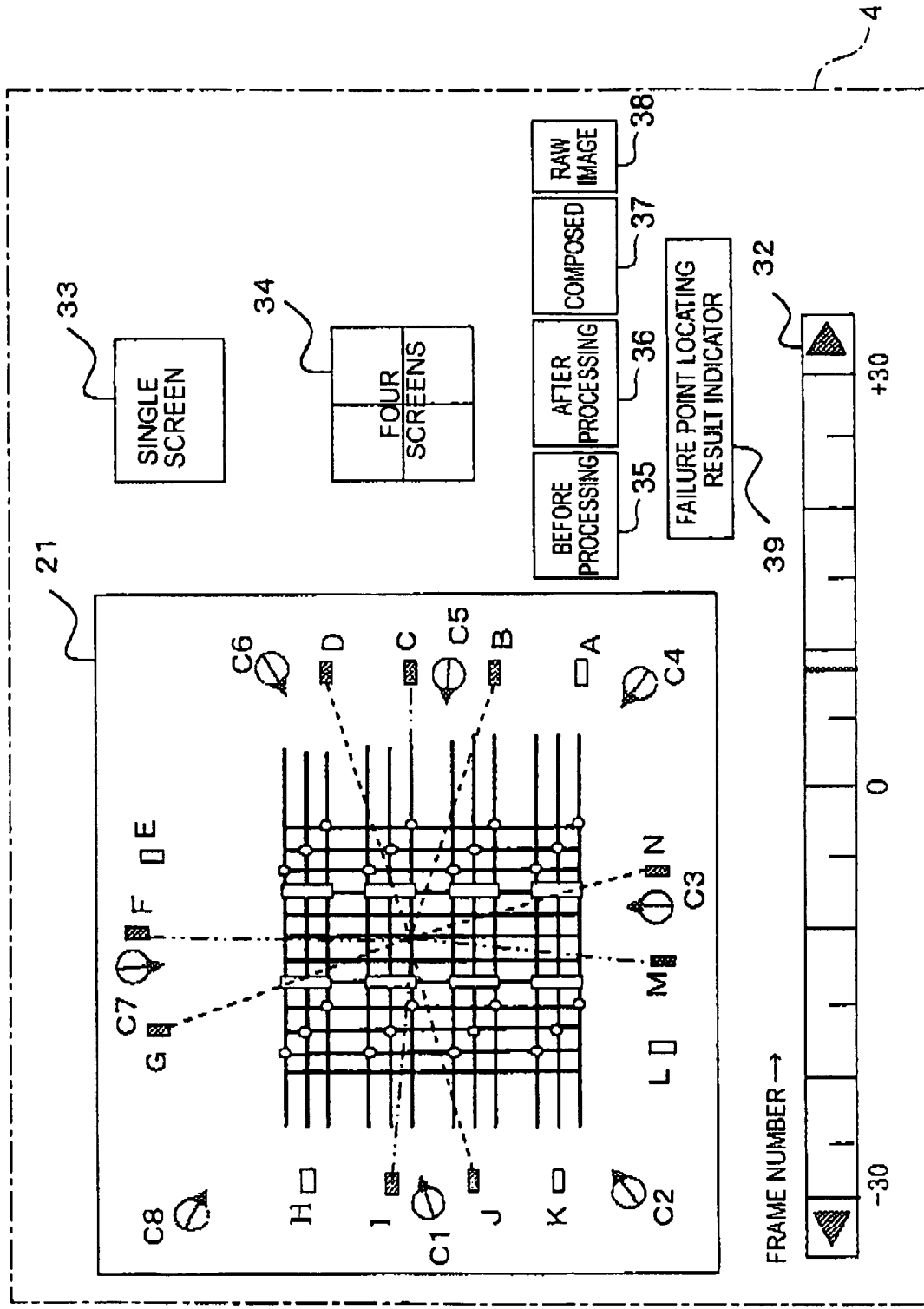
FIG. 3 An explanatory view of a screen of a PC operation device according to the first embodiment of the present invention (first embodiment).

FIG. 3 is an explanatory view of the display section and the operation section of the PC operation device 4 according to the first embodiment of the present invention.

In FIG. 3, the plan view of the substation 21 is shown along with the respective cameras and the results of locating.

A frame indicator 32 shows frame numbers (−30 to +30) of images for the locating received from the arc monitor cameras 1. In this case, it is intended to use the same frame number for all the arc monitor camera 1 for the locating.

Of respective switches 33 to 38 on the PC operation device 4, a single screen switch 33 and a four-screen switch 34 switch a condition of the screen displayed on the monitor 8 shown in FIG. 1 to a single screen display or a four-screen display.

Moreover, the state of the screen displayed on the monitor 8 is selected by means of an image selection switch 35 which is used to select an image output from the arc monitor cameras 1 before processing, an image selection switch 36 which is used to select an image obtained after the processing which composes a processed image according to an image processing algorithm (described later) with an actual image output from the camera, a composed image switch 37, and a switch 38 used to switch to a raw image.

The composed image switch 37, under a condition where it is difficult to locate a occurred place of an arc based on images (such as a fog condition or a night condition), is selected to compose an image of a subject captured in daytime with a processed image used to locate an arc thereby allowing the locating.

The switch 38 is selected to switch a displayed image to the image (raw image) input from the image processing device 2.

A failure point locating result indicator 39 includes a window used to display a result of locating a failure point such as "Do not apply voltage on A bus" and "Unable to locate (inconsistency)"

Figure 4:
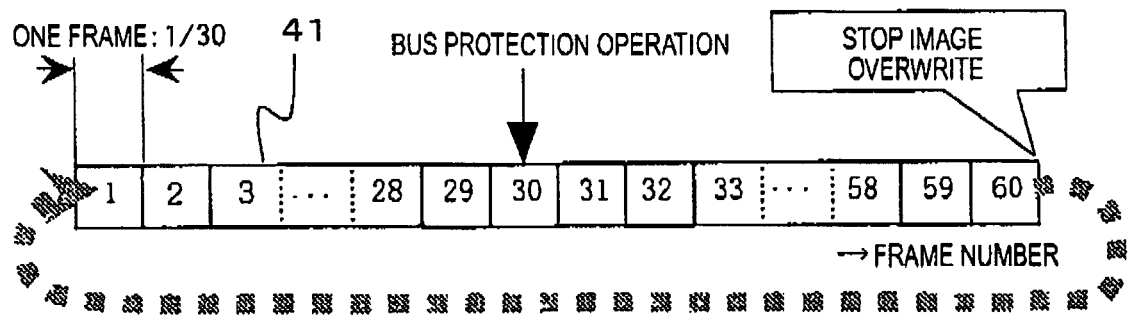
FIG. 4 An explanatory view showing image frames in an image processing basic operation used to locate a failure point according to the first embodiment of the present invention (first embodiment).
Figure 5:
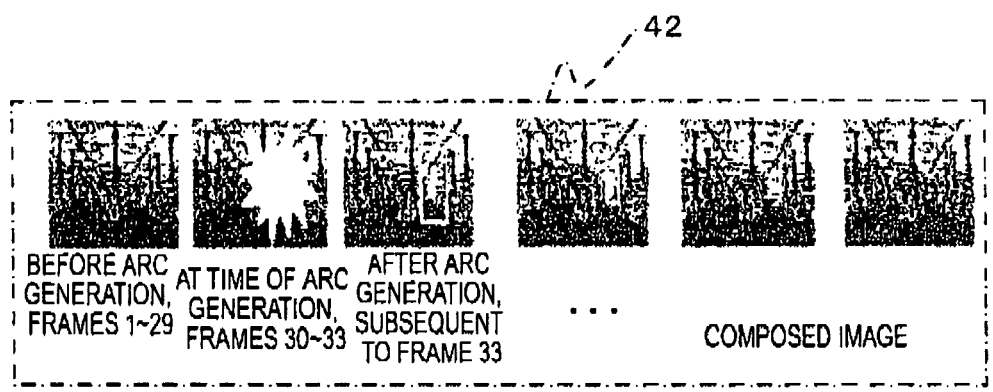
FIG. 5 An explanatory view showing an example of composed images of the respective frames in the image processing basic operation used to locate a failure point according to the first embodiment of the present invention (first embodiment).
Figure 6:
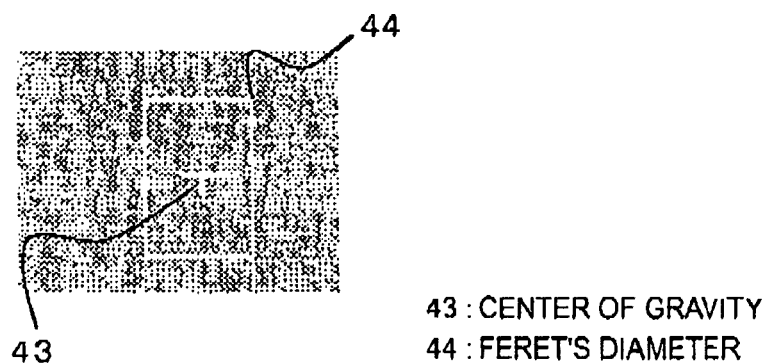
FIG. 6 An explanatory view showing a position of a center of gravity and a feret's diameter in the image processing basic operation used to locate a failure point according to the first embodiment of the present invention (first embodiment).

FIGS. 4 to 6 are explanatory views showing basic operation to locate a failure point according to the first embodiment of the present invention.

In FIG. 4, an image record 41 captured by the arc monitor camera 1 is schematically shown as a record processed by the image processing device 2.

In the image record 41, sixty frames 1 to 60, each of which usually corresponds to 1/30 [sec], are repeated as a broken arrow shows, and are recorded endlessly.

In FIG. 5, a composed image 42 is successively generated, as an image obtained after the processing, by composing the actual image output from the camera with the signal to which the image processing has been applied, in corresponding to the respective frames.

The composed image 42 is obtained in the image processing device 2 by processing a change in brightness with respect to data of a previous frame.

This example representatively shows frames 1 to 29 obtained before a generation of an arc, frames 30 to 33 obtained at a time of the generation of the arc, and frames 33 to 60 obtained after the generation of the arc.

FIG. 6 shows an XY coordinate of a center of gravity 43 of the arc, and a feret's diameter 44.

It should be noted that the center of gravity 43 of the arc is obtained as follows.

First, when a moving object appears in an image, changes occur in pixels corresponding to a portion of the object. On this occasion, if pixels presenting the change are in contact with each other, it is considered that the pixels represent the same object, and thus are combined, and a finally combined area of the change is recognized as a "moving portion". This "moving portion" represents a silhouette of the moving object, and a center of gravity of the silhouette is obtained as the center of gravity 43 of the arc.

The center of gravity 43 is a position of a center of gravity of brightness obtained after the image processing, and is represented as "+". Moreover, the feret's diameter 44 shows an area (circumscribing rectangle) of a change in the brightness compared with an image of the previous frame.

With reference to FIGS. 2 to 6, a description will now be given of a specific operation according to the first embodiment of the present invention shown in FIG. 1.

When an arc discharge occurs, the bus protection signal 10 output from the electric facility is input to the control logic section 3.

The respective processing devices 2 record camera images input from the arc monitor cameras 1 in respective image memories for two seconds, according to a control signal sent from the control logic section 3 in response to the bus protection signal 10.

On this occasion, a recording period of the camera image is approximately one second for both before and after the generation timing of the bus protection signal 10, namely a total of two seconds.

Moreover, since the recording operations for the respective camera images are started by the same bus protection signal 10, the time axes of the respective recorded images coincide.

Subsequently, immediately after a completion of the image recording, the respective image processing devices 2 start the image processing in cooperation with the control logic section 3.

On this occasion, the arc discharge is located by the following image processing algorithm (1) to (8) executed by the respective image processing devices 2. A description will be given of one arc monitor camera 1 as a representative.

(1) First, a "moving portion" is extracted from a recorded image. In this case, arc light (or a remaining heat portion thereof) on a occurrence of an arc discharge is extracted.

(2) Then, there is obtained an XY coordinate of the center of gravity 43 of the extracted "moving portion". This coordinate is a coordinate on the monitor 8 while the upper left corner of the image is (0, 0) when the camera image is displayed on the monitor.

(3) Moreover, a circumscribing rectangle (feret's diameter) 44 of the "moving portion" is obtained similarly.

(4) Subsequently, the coordinate of the center of gravity 43 and the feret's diameter 44 are successively obtained in the images recorded for two seconds.

(5) Then, there is observed a positional relationship between a feret's diameter 44 (n) obtained from an image of a certain frame and a feret's diameter 44 (n+1) obtained from an image of the next frame.

(6) On this occasion, only when the respective feret's diameters 44 (n) and 44 (n+1) include the center of the gravity 43, these two frames are defined as being "associated".

(7) A frame in which the "association" continuing in this way is disrupted corresponds to a portion where the arc light (or the remaining heat thereof) of the arc discharge continues until the end, namely, a position with the highest quantity of the light emission (or a position with the highest quantity of the remaining heat).

(8) The center of gravity 43 of the "moving portion" on this occasion is assumed to be a center of gravity of a light emitting point of the arc discharge estimated from the camera images.

The above processes (1) to (8) are executed for all the arc monitor cameras 1, and coordinate information on the arc discharge is created for all the arc monitor cameras 1.

Frames to be processed are determined as frames with the minimum feret's diameter of all the recorded sixty frames. Moreover, the coordinate of the center of gravity 43 of the arc is calculated for all the fourteen cameras (cameras A to N shown in FIG. 2), and calculated results are shown as broken lines and the long dashed double-short dashed lines of FIG. 3 along with the result of locating the occurred place of the arc, on the screen of the PC operation device 4.

A description will now be given of a process to arbitrary select two cameras, and to convert the coordinate information to a coordinate on the plan view as shown in FIG. 2.

The description will be given of an example for a combination of the camera I and the camera M shown in FIG. 2 for the coordinate conversion.

First, based on a coordinate calculated from the image captured by the camera I, a line is drawn from the camera I in a direction indicated by this coordinate on the plan view.

Similarly, a line is drawn from the camera M.

If the calculated coordinates indicate the center of the screen, the line drawn from the camera I is a perpendicular line of the line drawn from the camera M.

A position where these two lines cross is an estimated place of the arc discharge.

The coordinate information on the plan view obtained as a result of the above locating is displayed as shown in FIG. 3.

On the screen of the PC operation device 4 shown in FIG. 3, multiple points of the generated arc located by the respective pairs of cameras are displayed over the plan view of the substation 21.

Alternatively, while a concentration of the multiple points of the occurred arc is being observed, only when the points of the occurred arc are concentrated in a certain range, a center point thereof may be displayed.

Moreover, a height of the occurred arc may be calculated from Y coordinate data for a camera with which an arc can be located to distinguish between a failure of a bus and a failure of a line, and a locating result of the failure point may be shown on the screen according to switched states of the respective switches 33 to 38.

When the area to locate the arc is determined according to the automatic processing in this way, the PC operation device 4 is operated to select a machine monitoring camera closest to the located arc position, and to direct the camera to the located position, and the located point may be displayed on the screen of the monitor 8, and may be simultaneously recorded in the VTR 7.

Namely, the located position of the arc discharge is displayed on the PC operation device 4 and the monitor 8, and simultaneously the machine monitoring camera 5 is rotated to the arc occurring portion, thereby capturing an image immediately after the arc discharge to be displayed on the screens, and recorded in the VTR 7.

Therefore, the image processing is used to automatically extract and locate the positions of the arc discharge from the images captured by the arc monitoring cameras.

Moreover, on the recognition and the extraction of a light emitting portion (or a heat remaining portion) occurred by an arc discharge, images of multiple frames (30 frames, for example) obtained before the occurrence of the arc discharge to immediately after the occurrence thereof are successively processed to obtain the level and the center of gravity 43 of the arc discharge in the successive images, and transitions of the level and the center of the gravity 43 of the arc discharge are observed to locate a precise position of the arc discharge.

Moreover, as shown in FIG. 2, since the multiple arc monitor cameras 1 and other related systems are provided in the substation 21 (electric facility), and the positions of the respective cameras are set such that at least two cameras can capture an arc discharge generated any position in the electric facility, when an arc discharge occurred in the electric facility, positions of the arc discharge located by the respective cameras and image processing systems are precisely calculated by means of the triangulation using the combinations of the images of the multiple cameras, and, as a result, it is possible to surely and precisely identify the position of the arc discharge on the plan view of the electric facility.

Moreover, since the occurred place of the arc discharge is extracted three-dimensionally by multiple cameras, and is identified by an XY coordinate, it is possible to locate the position with high precision.

Moreover, in addition to locating an arc, for the purpose of finding a cause of a failure, to analyze images frame by frame from an image obtained before a occurrence of an arc to an image obtained immediately after the arc, the number of the frames may be manually specified to simultaneously monitor optimal screens and optimal multiple arc monitor cameras 1.

Moreover, when a subject to be monitored is hard to observe due to different climate conditions such as fog, rain, and snow, it is possible to identify a occurred place of an arc by composing a background recorded in advance with a screen used to locate the arc.

Moreover, as an image of the arc monitor camera 1, it is possible to select a recorded image obtained before the processing, an image obtained after the processing, a composed image, and an input image for the image processing (raw image) by selecting operation of the respective switches 35 to 38.

Moreover, cameras for near-infrared from which visible light is removed are used as the arc monitor cameras 1. The near-infrared cameras are used to capture images in the electric facility, and influence of sun light which is an interference noise is thus restrained, resulting in increasing the reliability of the arc monitoring.

Moreover, a occurred place of an arc discharge is identified, a range to locate a failure point is clarified according to a switching state of a line switch, and, thus, a cause of the accident is quickly investigated, and the failure is quickly recovered.

Moreover, as described above, a remaining heat energy of smoke extending in a vicinity immediately after an arc discharge can be observed to visually recognize remaining heat in a temporally long period and across a spatially wide range, and it is thus possible to reduce a miss to recognize an arc discharge due to an obstacle present between the arc and the respective arc monitor cameras 1 and a miss to recognize an arc discharge due to a small image captured at a long distance.

Moreover, by detecting remaining heat after an arc discharge, it is possible to detect in a current of an arc discharge in a wide range from 100 A to 63 kA.

Although according to the above first embodiment, an arc discharge occurred between live lines of an electric facility is monitored, an arc discharge occurred in other places in the electric facility may be monitored. Moreover, although the multiple image processing devices 2, the PC operation board 4, the VTR 7, and the bus protection signal 10 are used, a single image processing device may be used, other operation board having the same functions as the PC operation board 4 may be used, and other image recording device and a control signal may be used in place of the VTR 7 and the bus protection signal 10.

The invention claimed is:

1. An arc monitor system, which determines a location of an arc discharge occurring in an electric facility, comprising:
   a plurality of monitor cameras, arranged at a plurality of locations in the electric facility, configured to capture images;
   an image processing unit configured to process images received from the monitor cameras;
   a control logic unit configured to control the image processing unit; and
   an operation unit, including a display section and an operation section, connected to the control logic unit,
   wherein the image processing unit and the control logic unit extract a change in the images captured by the monitor cameras in response to a control signal generated from the electric facility on an occurrence of the arc discharge, and determine the location of the arc discharge as a two-dimensional coordinate based on the images captured by at least two of the monitor cameras.

2. The arc monitor system according to claim 1, wherein the image processing unit and the control logic unit, on recognizing and extracting the arc discharge, process a plurality of successive frames of the image ranging from a frame obtained before the occurrence of the arc discharge to a frame obtained after an extinction of the arc discharge, obtain a level and a center of gravity of the arc discharge in the successive frames, and observe transitions of the level and the center of gravity of the arc discharge, thereby determining the location of the occurrence of the arc discharge.

3. The arc monitor system according to claim 1, wherein:
   the monitor cameras are arranged such that all locations in the electric facility are imaged by at least two of the monitor cameras; and
   the image processing unit and the control logic unit, on the occurrence of the arc discharge, process the images captured by at least two of the monitor cameras to calculate the location by triangulation.

4. The arc monitor system according to claim 1, wherein each of the monitor cameras includes a near-infrared camera that captures an image with near-infrared light.

5. The arc monitor system according to claim 1, wherein the image processing unit and the control logic unit observe a change in a remaining heat energy of the arc discharge immediately after the occurrence of the arc discharge.

6. The arc monitor system according to claim 1, further comprising:
an image switching unit connected to the image processing unit; and
an image recording unit and a monitor connected to the image switching unit,
wherein the location of the arc discharge determined by the image processing unit and the control logic unit is displayed on the monitor and the operation unit as a plan view, and is simultaneously recorded in the image recording unit.

7. The arc monitor system according to claim 1, wherein each of the monitor cameras includes a panning camera, the panning camera turns in the direction of the location of the arc discharge when the location of the arc discharge is determined, and captures an image immediately after the occurrence of the arc discharge.

8. The arc monitor system according to claim 1, wherein the electric facility is a substation.

9. The arc monitor system according to claim 1, wherein the monitor cameras are arranged in pairs that are orthogonal to one another.

10. The arc monitor system according to claim 1, wherein the location of the arc discharge is determined on a coordinate system on a plan view.

11. The arc monitor system according to claim 1, wherein the location of the arc discharge is determined by calculating an intersection of vectors extending from two monitor cameras that detect the arc discharge, the intersection being the location of the arc discharge.

12. An arc monitor system, which determines a location of an arc discharge occurring in an electric facility, comprising:
a plurality of monitor cameras, arranged at a plurality of locations in the electric facility, that capture images;
an image processing unit that processes images received from the monitor cameras;
a control logic unit that controls the image processing unit; and
an operation unit, including a display section and an operation section, connected to the control logic unit,
wherein the image processing unit and the control logic unit extract a change in the images captured by the monitor cameras in response to a control signal generated from the electric facility on an occurrence of the arc discharge, and determine the location of the arc discharge; and
wherein the monitor cameras are arranged such that all locations in the electric facility are imaged by at least two of the monitor cameras; and
the image processing unit and the control logic unit, on the occurrence of the arc discharge, process the images captured by at least two of the monitor cameras to calculate the location by triangulation.

13. An arc monitor system, which determines a location of an arc discharge occurring in an electric facility, comprising:
a plurality of monitor cameras, arranged at a plurality of locations in the electric facility, that capture images;
an image processing unit that processes images received from the monitor cameras;
a control logic unit that controls the image processing unit; and
an operation unit, including a display section and an operation section, connected to the control logic unit,
wherein the image processing unit and the control logic unit extract a change in the images captured by the monitor cameras in response to a control signal generated from the electric facility on an occurrence of the arc discharge, and determine the location of the arc discharge; and
wherein the image processing unit and the control logic unit observe a change in a remaining heat energy of the arc discharge immediately after the occurrence of the arc discharge.

14. An arc monitor system, which determines a location of an arc discharge occurring in an electric facility, comprising:
a plurality of monitor cameras, arranged at a plurality of locations in the electric facility, that capture images;
an image processing unit that processes images received from the monitor cameras;
a control logic unit that controls the image processing unit;
an operation unit, including a display section and an operation section, connected to the control logic unit,
wherein the image processing unit and the control logic unit extract a change in the images captured by the monitor cameras in response to a control signal generated from the electric facility on an occurrence of the arc discharge, and determine the location of the arc discharge;
an image switching unit connected to the image processing unit; and
an image recording unit and a monitor connected to the image switching unit,
wherein the location of the arc discharge determined by the image processing unit and the control logic unit is displayed on the monitor and the operation unit as a plan view, and is simultaneously recorded in the image recording unit.

* * * * *